United States Patent [19]
Moulton et al.

[11] Patent Number: 5,371,408
[45] Date of Patent: Dec. 6, 1994

[54] INTEGRATED CIRCUIT PACKAGE WITH REMOVABLE SHIELD

[75] Inventors: Walter L. Moulton; Paul A. Ogden, both of Phoenix; Shay-Ping Wang, Tempe, all of Ariz.

[73] Assignee: Motorola, Inc., Schaumburg, Ill.

[21] Appl. No.: 800,316

[22] Filed: Nov. 29, 1991

[51] Int. Cl.⁵ .............................................. H01L 23/28
[52] U.S. Cl. ................................... 257/730; 257/680; 257/704
[58] Field of Search ..................... 357/72, 74; 361/212; 257/680, 704, 730, 666, 787

[56] References Cited
U.S. PATENT DOCUMENTS

| | | | |
|---|---|---|---|
| 4,878,108 | 10/1989 | Phelps, Jr. et al. | 357/72 |
| 4,918,513 | 4/1990 | Kurose et al. | 257/693 |
| 5,031,069 | 7/1991 | Anderson | 357/74 |
| 5,038,248 | 8/1991 | Meyer | 257/666 |

*Primary Examiner*—Robert P. Limanek
*Assistant Examiner*—Roy Potter

[57] ABSTRACT

An integrated circuit package with a removable shield is disclosed. An integrated circuit having a plurality of interface leads is mounted on a TAB carrier. A removable shield fabricated from a spring material is clipped to the TAB carrier. A limited opening through the removable shield allows a predetermined access to the integrated circuit.

5 Claims, 2 Drawing Sheets

INTEGRATED CIRCUIT PACKAGE WITH REMOVABLE SHIELD

BACKGROUND OF THE INVENTION

The present invention relates, in general, to integrated circuit packages, and more particularly to integrated circuit packages with removable protective shields.

The tape automated bonding (TAB) process for packaging of high density semiconductor parts has proven to be useful for a wide range of parts. As the density of connections increases, however, the individual connection path must become smaller and more closely spaced. This high density makes such parts extremely fragile and also makes repair impractical. As a result, a single touch or blast of compressed air can ruin a part. Handling can cause a lead to be bent or scratched, can cause electrostatic damage to the part itself or introduce foreign objects which themselves cause damage. Despite these hazards the parts must be handled repeatedly for assembly, sealing, testing, marking and shipping. This repeated handling and the resultant damage introduces a significant yield loss since these otherwise good parts must be scrapped. Scrapping a part near the end of a long and complex manufacturing process is expensive because the value added in each previous step is also scrapped.

There is a need for some form of protection for the fragile TAB mounted part which will protect the part during normal handling. This protection must protect the part, yet still allow sufficient access to the part so as not to interfere with manufacturing and testing operations. The protection means must be easily removable since some operations require access to the entire package assembly. At the same time the protection must be fastened securely enough to the package that it won't jar loose during normal handling and shipment.

SUMMARY OF THE INVENTION

Briefly stated, the present invention provides an integrated circuit package with a removable shield. An integrated circuit having a plurality of interface pins is mounted on a TAB leadframe. The TAB leadframe is mounted upon a TAB carrier. A removable shield fabricated from a spring material is clipped to the TAB carrier. A limited opening through the shield allows a predetermined access to the integrated circuit.

DETAILED DESCRIPTION OF THE DRAWINGS

Figure 1:
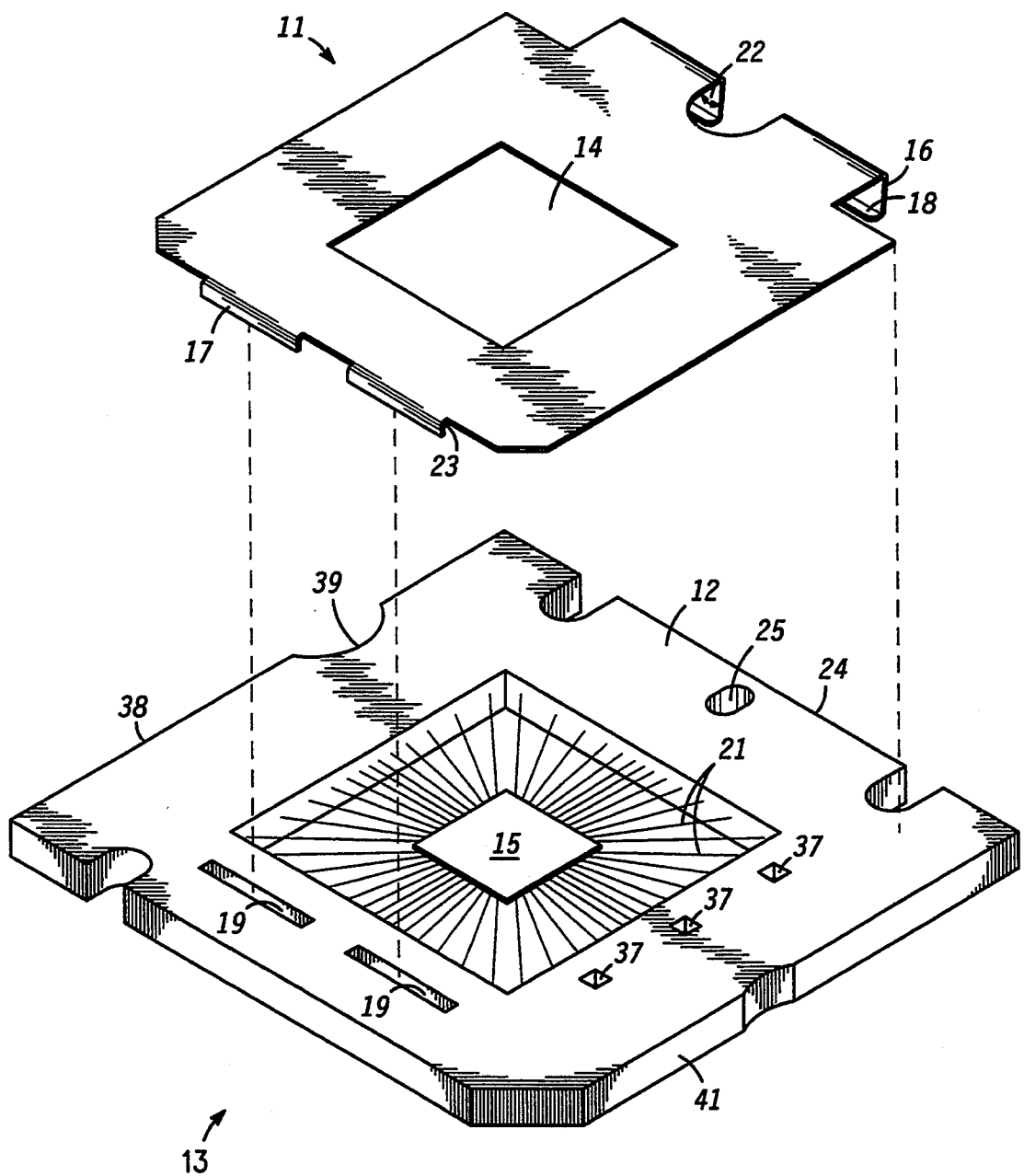
FIG. 1 shows a perspective view of an integrated circuit package with a removable shield as a preferred embodiment of the present invention.

FIG. 1 shows an integrated circuit package 13 with a removable shield 11 as a preferred embodiment of the present invention. Integrated circuit package 13 uses the tape automated bonding (TAB) method to package an encapsulated integrated circuit die 15. Integrated circuit package 13 has a plurality of leads 21 which provide electrical connections to encapsulated integrated circuit die 15. Leads 21 are supported by a TAB carrier 12, thus supporting encapsulated integrated circuit die 15. Removable shield 11 is fabricated from a sheet of spring steel which is approximately 0.127 mm thick. Spring steel material is used to ensure that the required shape is maintained despite bending during repeated use. Removable shield 11 is mounted on TAB carrier 12. A pair of edge fingers 18 are formed to grip the bottom of TAB carrier 12 and are supported by a pair of edge strips 16. Edge strips 16 are bent to form an acute angle 22, of approximately 82 degrees. A pair of slot fingers 17 are formed at the opposite end of removable shield 11. Slot fingers 17 are bent to form an acute angle 23 of approximately 87 degrees. Slot fingers 17 are formed to be of such size and shape as to fit a matching pair of slots 19. Slots 19 are fabricated as part of TAB carrier 12. The spacing between slot fingers 17 and edge strips 16 is fitted so that slot fingers 17 will grip the edges of slots 19 when edge strips 16 are positioned along an edge 24 of TAB carrier 12. Sufficient spring tension is provided between slot fingers 17 and edge strips 16 to hold removable shield 11 firmly in place on TAB carrier 12 by spring action alone. An opening 14 is made in the central area of removable shield 11. Opening 14 is of such size and shape as to allow a predetermined access to encapsulated integrated circuit die 15 without exposing leads 21.

Removable shield 11 provides protection to the top of leads 21 and to some extent also to encapsulated integrated circuit die 15. Removable shield 11 allows sufficient access for some manufacturing steps without disturbing removable shield 11. Access from the bottom is provided for manufacturing steps such as testing and from the top for manufacturing steps such as marking the part code. For manufacturing steps requiring greater access to encapsulated integrated circuit die 15 or leads 21, removable shield 11 is readily removed and replaced. For convenience a jig or a custom tool is typically used for this purpose. A hole 25, adjacent to edge 24, is used by handling equipment to precisely locate integrated circuit package 13 on machinery for manufacturing and testing operations. An adjacent edge 38 has a locating indent 39 which serves to further align integrated circuit package 13. On a third side 41 are located a plurality of depressions 37 which provide a third alignment means for integrated circuit package 13.

For convenience a jig is typically used to attach and remove removable shield 11. A loading jig typically comprises a plurality of locator pins which precisely locates integrated circuit package 13 in position and guide bars which serve to align removable shield 11. Removable shield 11 is then pressed into place on integrated circuit package 13. Removal of removable shield 11 is typically accomplished in a similar fashion using a vacuum cup to pull removable shield 11 from integrated circuit package 13.

Figure 2:
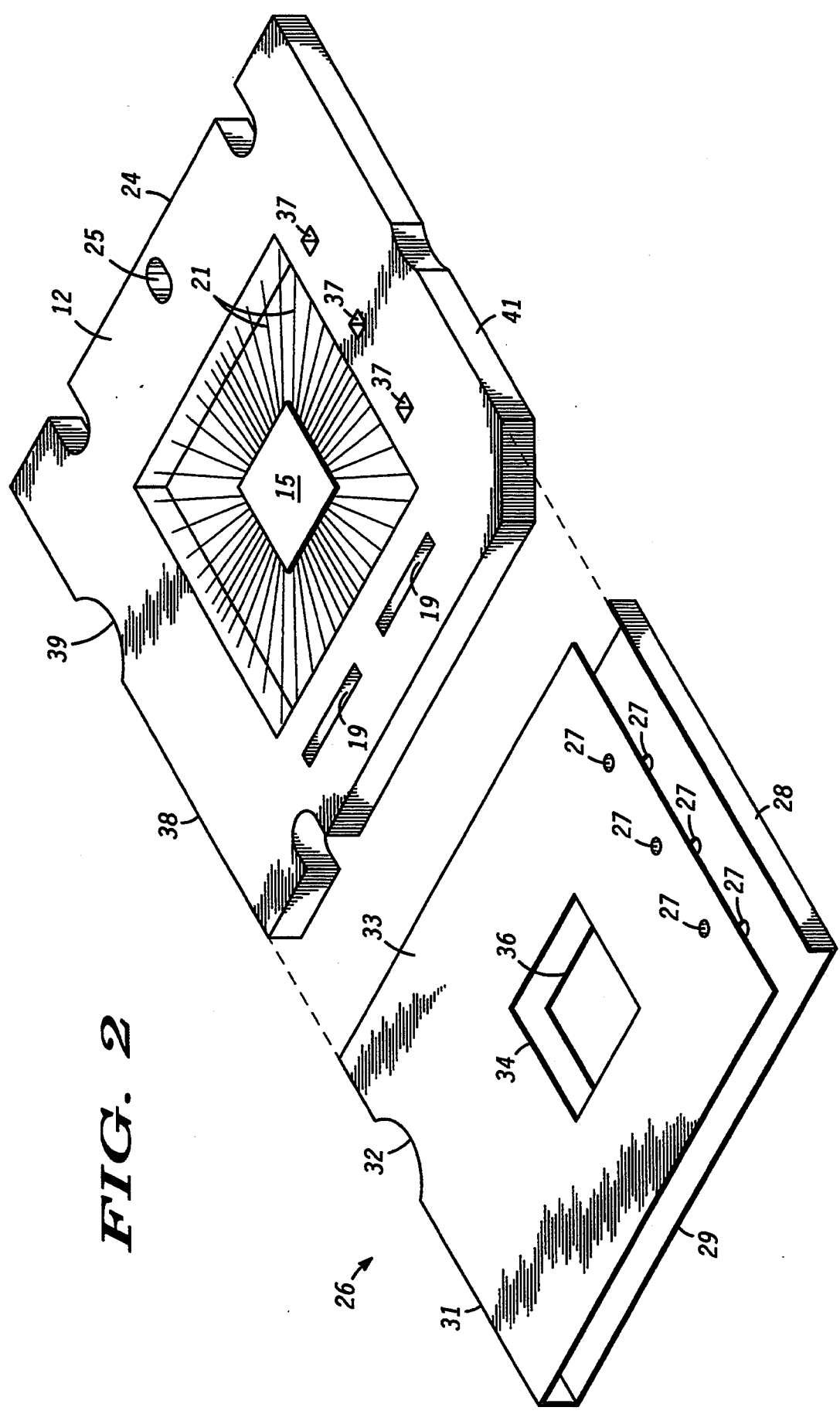
FIG. 2 shows a perspective view of the integrated circuit package shown in FIG. 1 with a removable shield as an alternative embodiment of the present invention.

FIG. 2 shows integrated circuit package 13 with a removable shield 26 as an alternative embodiment of the present invention. Removable shield 26 is fabricated from a sheet of spring steel which is approximately 0.127 mm thick. Spring steel material is used to ensure that the required shape is maintained despite slight bending during repeated use. Removable shield 26 is sized and shaped to closely fit TAB carrier 12. A top shield 33, an edge support 31 and a bottom shield 29 form a U shaped section which serves to protect both top and bottom of encapsulated integrated circuit die 15 and leads 21. Top shield 33 and bottom shield 29 are supported such that the open end is spaced more closely than the spacing of edge support 31. This provides a spring action which serves to grip TAB carrier 12 under pressure holding removable shield 26 in place. A plurality of dimples 27 are formed near one end of top shield 33 and bottom shield 29 which mate with depressions 37 in TAB carrier 12. Dimples 27 together with depressions 37 serve to hold removable shield 26 in a desired position on TAB carrier 12. When removable shield 26 is mounted or removed, edge support 31 slides along edge 38. Likewise, an edge finger 28 along the end of lower shield 29 slides along edge 41 of TAB carrier 12 preventing undesired lateral movement by removable shield 26. A locating cutout 32 is formed to match locating indent 39 which together serve to align both removable shield 26 and TAB carrier 12 in a desired orientation. A top opening 34 is made in the central area of top shield 33. A bottom opening 36 is made in the central area of bottom shield 29. Top opening 34 and bottom opening 36 are of such size and shape as to allow a predetermined access to encapsulated integrated circuit die 15 without exposing leads 21.

In contrast to removable shield 11 (FIG. 1), removable shield 26 provides protection to both top and bottom of leads 21 and encapsulated integrated circuit die 15. Removable shield 26 allows sufficient access for some manufacturing steps while in place. Access from the top is provided for manufacturing steps such as marking or stamping the part code. Removable shield 26 must be removed for manufacturing steps which require access to leads 21 such as testing. For those manufacturing steps which require greater access to encapsulated integrated circuit die 15 or leads 21, removable shield 26 is readily removed and replaced by sliding removable shield 26 along edge 38. For convenience a jig similar to the jig used to attach and remove removable shield 11 is typically used for removable shield 26. The jig has two vacuum chucks which hold top shield 33 and bottom shield 29 allowing integrated circuit package 13 to be inserted or removed.

By now it should be clear that an integrated circuit package with a removable protective shield can provide a significant reduction in scrapped parts during the final stages of integrated circuit manufacture. Since these parts are almost completely finished each scrapped part represents the loss of a large investment. Due to the size and density of the packages, especially the leads, rework and repair is not possible. This same size and density makes the package even more delicate and prone to damage. The shield provides protection from both physical hazards and electrostatic hazards while allowing access for many of the manufacturing steps. The shield design may easily be modified to provide more protection at the expense of reduced access or increased access at the expense of the degree of protection. In practice the choice of the amount of access desired will depend on the characteristics of the particular package and the particular handling steps required. For those steps which require more access than the shield allows, the shield may be readily removed. Typically an automatic shield removal device will be incorporated as part of the handling equipment, facilitating removal while minimizing exposure to manual handling.

We claim:

1. An integrated circuit package with a removable shield comprising:
   an encapsulated integrated circuit having a plurality of leads;
   a carrier which supports the encapsulated integrated circuit;
   a removable shield fabricated from a conductive material mounted on the carrier so as not to make contact with the encapsulated integrated circuit, the removable shield being of such a size and shape as to be held in place on the carrier by spring action; and
   an opening through the removable shield to allow a predetermined access to the encapsulated integrated circuit, wherein the opening has a size to minimize exposure of the plurality of leads.

2. An integrated circuit package with removable shield, comprising:
   an encapsulated integrated circuit having a plurality of leads;
   a carrier which supports the encapsulated integrated circuit; and
   a removable shield fabricated from a conductive material mounted on the carrier, the removable shield being of such a size and shape as to be held in place on the carrier by spring action, wherein the encapsulated integrated circuit and associated carrier are suited for use in tape automated bonding.

3. A method for protecting a packaged integrated circuit with a removable shield, comprising:
   packaging an integrated circuit with a package having a plurality of leads;
   mounting the package on a carrier;
   fitting a removable shield fabricated from a spring material onto the carrier in such a way as to protect the plurality of leads from mechanical damage; and
   opening a hole in the shield to allow a predetermined access to the package, wherein the opening has a size to minimize exposure of the plurality of leads.

4. An integrated circuit package with a removable shield, comprising:
   an encapsulated integrated circuit die having a plurality of leads;
   a TAB carrier which supports the encapsulated integrated circuit die;
   a removable shield fabricated from a metallic spring material of a predetermined thickness which clips onto the TAB carrier, the removable shield being of such a size and shape as to be held in place on the TAB carrier solely by spring action of the removable shield; and
   an opening through the shield to allow a predetermined access to the TAB package.

5. The integrated circuit package with removable shield of claim 4 further comprising:
   a plurality of fingers on the removable shield which serve to grip the TAB carrier by spring action, serving to securely hold the removable shield in place on the TAB carrier.

* * * * *